(12) United States Patent
Tsai et al.

(10) Patent No.: US 7,652,302 B2
(45) Date of Patent: Jan. 26, 2010

(54) METHOD OF MAKING LIGHT EMITTING DIODE

(75) Inventors: Tzong-Liang Tsai, Hsinchu (TW);
Way-Jze Wen, Hsinchu (TW);
Chang-Han Chiang, Hsinchu (TW);
Chih-Sung Chang, Hsinchu (TW)

(73) Assignee: Epistar Corporation (TW)

( * ) Notice: Subject to any disclaimer, the term of this patent is extended or adjusted under 35 U.S.C. 154(b) by 297 days.

(21) Appl. No.: 11/108,966

(22) Filed: Apr. 19, 2005

(65) Prior Publication Data

US 2006/0163599 A1 Jul. 27, 2006

(30) Foreign Application Priority Data

Jan. 21, 2005 (TW) .............................. 94101800 A

(51) Int. Cl.
*H01L 33/00* (2006.01)
(52) U.S. Cl. .............................. 257/99; 257/13; 257/98; 257/E25.032
(58) Field of Classification Search ................... 257/98, 257/99, 13, E29.072, E21.01, E33.008, E33.066, 257/E25.032
See application file for complete search history.

(56) References Cited

U.S. PATENT DOCUMENTS

| 5,665,985 | A * | 9/1997 | Iwata ........................... 257/95 |
| 6,818,531 | B1 * | 11/2004 | Yoo et al. .................... 438/458 |
| 7,179,671 | B2 * | 2/2007 | Okazaki et al. ............... 438/26 |
| 2003/0164503 | A1 * | 9/2003 | Chen ........................... 257/79 |
| 2004/0248377 | A1 * | 12/2004 | Yoo et al. .................... 438/458 |
| 2005/0035364 | A1 * | 2/2005 | Sano et al. .................... 257/99 |
| 2006/0154389 | A1 * | 7/2006 | Doan ........................... 438/21 |

\* cited by examiner

*Primary Examiner*—Lynne A. Gurley
*Assistant Examiner*—Samuel A. Gebremariam
(74) *Attorney, Agent, or Firm*—Ingrassia Fisher & Lorenz, P.C.

(57) ABSTRACT

A light emitting diode and the method of the same are provided. A light emitting diode epitaxy structure is formed on a substrate, and then the light emitting diode epitaxy structure is etched to form a recess. The recess is then filled with a transparent dielectric material. An ohmic contact layer and a reflective layer are formed sequentially, and then are etched to expose the transparent dielectric material. Finally, forming an adhesive conductive complex layer to fix the ohmic contact layer and the reflective layer on the light emitting diode epitaxy structure.

23 Claims, 3 Drawing Sheets

METHOD OF MAKING LIGHT EMITTING DIODE

CLAIM PRIORITY

This Application claims the right of priority based on Taiwan Patent Application No. 094101800 filed on Jan. 21, 2005.

FIELD OF THE INVENTION

The present invention relates to a light emitting diode and its fabricating method.

BACKGROUND OF THE INVENTION

Since Light emitting diodes (LEDs) have the advantages of low production cost, simple structure, less consuming power, small size and easy installation, they are widely applied in light sources and display devices.

Traditionally, an LED includes an LED epitaxy structure, a reflective layer and an ohmic contact layer, which are sequentially formed on a substrate. The LED epitaxy structure includes an n-type semiconductor layer, an active layer and a p-type semiconductor layer. The reflective layer is used to reflect lights produced from the LED epitaxy structure, making lights emit toward a same direction and increasing the brightness of the LED. Silver having high reflective index, is therefore widely used as the material of the reflective layer. However, silver may migrate into the LED epitaxy structure as time elapses, causing the leakage of electricity and decreasing the performance of the LED. Therefore, the ohmic contact layer over the reflective layer is provided to prevent silver from migrating into the LED epitaxy structure.

In addition, peelings may occur between the reflective layer and the LED epitaxy structure due to poor adhesion between silver and the LED epitaxy structure, and cracks may also occur between each layer in the LED epitaxy structure due to variation of the process temperature during a conventional lift-off step for the substrate.

Therefore, there is a need to provide a light emitting diode and its fabricating method to enhance the adhesion between the reflective layer and the LED epitaxy structure or between each layer in the LED epitaxy structure.

SUMMARY OF THE INVENTION

One aspect of the present invention is to provide an LED and its fabricating method to improve the adhesion between the reflective layer and the LED epitaxy structure.

Another aspect of the present invention is to provide an LED and its fabricating method to improve the adhesion between each layer in the LED epitaxy structure.

A method of fabricating an LED of the present invention includes forming an LED epitaxy structure on a substrate, etching the LED epitaxy structure to form a recess and at least partially filling the recess with a transparent dielectric material. Subsequently forming an ohmic contact layer and a reflective layer, etching the reflective layer and the ohmic contact layer to expose the transparent dielectric material, and finally forming an adhesive conductive complex layer. The ohmic contact layer and the reflective layer are fixed on the LED epitaxy structure by good adhesion between the adhesive conductive complex layer and the transparent dielectric material.

AN LED of the present invention includes a conductive substrate, an adhesive conductive complex layer, a reflective layer, an ohmic contact layer, an LED epitaxy structure and a transparent dielectric layer. The adhesive conductive complex layer is disposed on the conductive substrate to secure the ohmic contact layer and the reflective layer on the LED epitaxy structure. The transparent dielectric layer is disposed on a sidewall of the LED epitaxy structure to improve the sidewall output of lights.

DETAILED DESCRIPTION

Figure 1A:
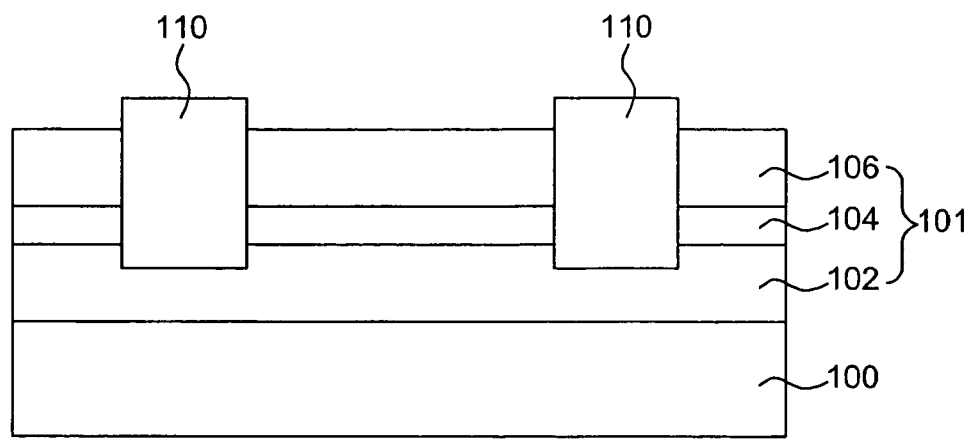
FIGS. 1A, 2, 3 and 4 show the profiles of the first embodiment of the present invention at different fabrication stages.

Referring to a structure of FIG. 1A, an LED epitaxy structure 101 is first fabricated on a substrate 100. The LED epitaxy structure 101 is then etched by using conventional lithography and etching technique, and filled with the transparent dielectric material to form a transparent dielectric layer 110. The LED epitaxy structure 101 mentioned herein includes an AlGaInP LED epitaxy structure and an AlGaInN LED epitaxy structure. To obtain an epitaxy structure of high quality, the selected material of the substrate 100 depends on the types of the LED epitaxy structure. As for the AlGaInP LED epitaxy structure, the preferred material of the substrate 100 is Ge, GaAs or InP. As for the AlGaInN LED epitaxy structure, the preferred material of the substrate 100 is sapphire, SiC, Si, LiAlO$_2$, ZnO or GaN.

The fabricating steps of the LED epitaxy structure 101 include sequentially forming an n-type semiconductor layer 102, an active layer 104, and a p-type semiconductor layer 106 on the substrate 100. The active layer 104 includes a homo-structure, a single hetero-structure, a double hetero-structure or a multi-quantum well structure. The distance between the centers of adjacent transparent dielectric layers 110 depends on the need of the designer. In one embodiment, the distance is preferably the width of the resultant LED (shown in FIG. 5A).

As shown in FIG. 1A, the LED epitaxy structure 101 is partially etched to a depth of n-type semiconductor layer 102. In other embodiments, the partial etch, instead of being precisely controlled, merely ensures that the n-type semiconductor layer 102 is partially exposed, so that the transparent dielectric layer 110 formed by the transparent material is deeper than a point where the n-type semiconductor layer 102 and the active layer 104 interfaced. Therefore, the transparent dielectric layer 110 can secure the LED epitaxy structure 101 during fabricating steps of the LED to ensure good adhesion between n-type semiconductor layer 102, the active layer 104 and p-type semiconductor layer 106, and to reduce peelings between each layer in the LED. In addition, the transparent dielectric layer 110, protruding on an upper surface of the p-type semiconductor layer 106, further secures the LED epitaxy structure 101.

Figure 1B:
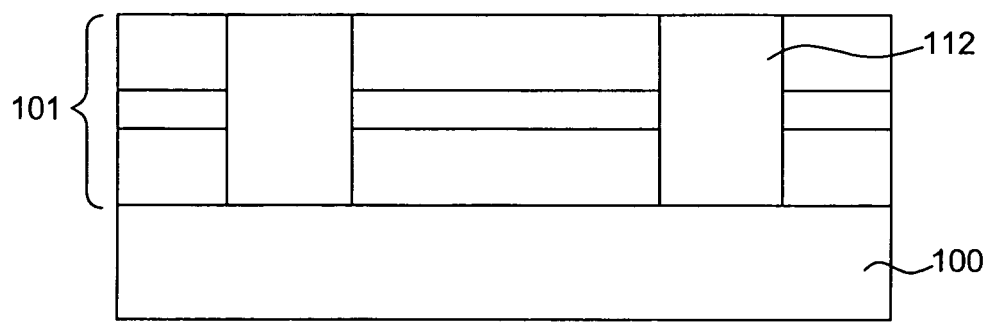
FIGS. 1B-1C are other embodiments of the present invention comparable to FIG. 1A.
Figure 1C:
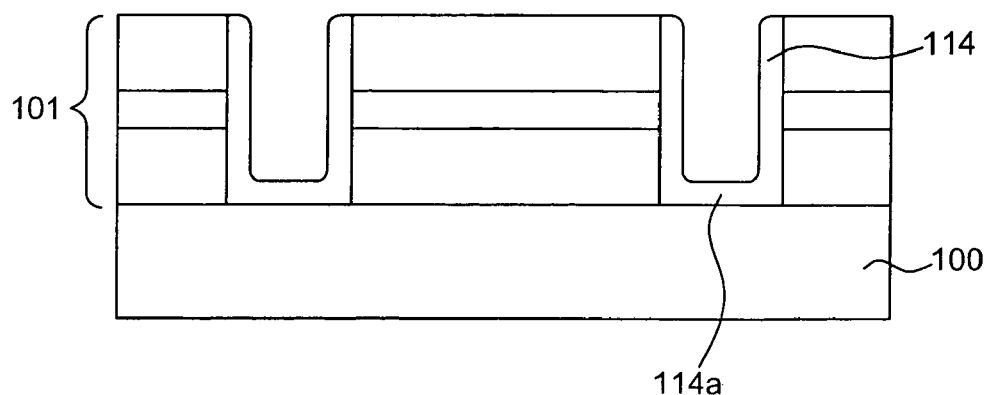

Other embodiments of the present invention, comparable to that in FIG. 1A, are disclosed in FIGS. 1B and 1C. The LED epitaxy structure 101 in FIG. 1B is etched to expose the substrate 100, and then filled with the transparent dielectric material to form a transparent dielectric layer 112. In FIG. 1C, a transparent dielectric liner 114 is formed to enhance the adhesion between the n-type semiconductor layer 102, active layer 104 and the p-type semiconductor layer 106, after the LED epitaxy structure 101 is etched. The transparent dielectric material for the liner 114 is selected from a group consisting of SiO$_2$, Si$_3$N$_4$, bisbenzocyclobutene and polyimide.

Figure 2:
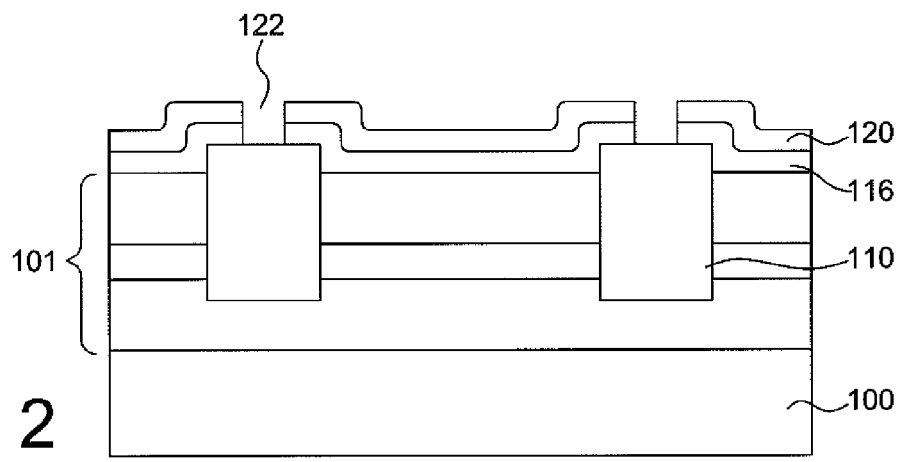

Next, referring to FIG. 2, an ohmic contact layer 116 and a reflective layer 120 are formed sequentially and then by using lithography and etching technology to form a first opening 122. The reflective layer 120 is used to reflect lights produced from the LED epitaxy structure 101, so that lights can emit toward a same direction. The ohmic contact layer 116 can prevent the material of the reflective layer 116, such as silver, from migrating into the LED epitaxy structure 101. The first opening 122 is then filled with the adhesive conductive material, so that the adhesive conductive material contacts the transparent dielectric layer 110, which will be explained below.

Figure 3:
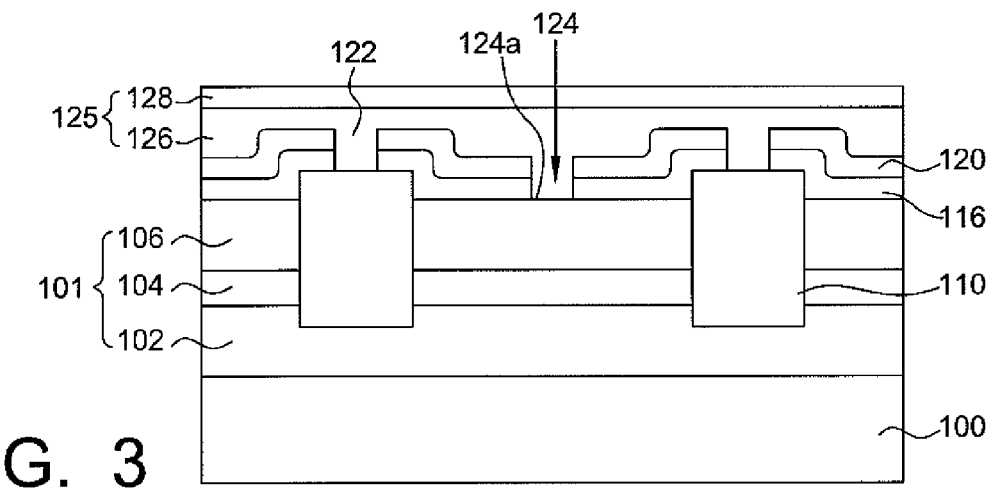

As disclosed in FIG. 3, the ohmic contact layer 116 and the reflective layer 120 are etched partially to form a second opening 124, and an adhesive conductive complex layer 125 is formed sequentially to contact the p-type semiconductor layer 106 at the Exposed surface 124a in the second opening 124. The adhesive conductive complex layer 125 can be a single layer or multiple layers, and any suitable material, which can adhere well to the transparent dielectric layer 110, and the conductive substrate 130 (FIG. 4) may be used for complex layer 125. In one embodiment of the present invention, the adhesive conductive complex layer 125 includes a first adhesive conductive layer 126 and a second adhesive conductive layer 128. The material of the first adhesive conductive layer 126 is selected from a group consisting of Cr, Ti, Pt and an alloy thereof, which contacts the transparent dielectric layer 110 and results in good adhesion. Therefore, the reflective layer 120 and the ohmic contact layer 116 are completely clad in the first adhesive conductive layer 126, the ohmic contact layer 116, the reflective layer 120 and each layer in the LED epitaxy structure 101 are adhered tightly to reduce peelings. The second adhesive conductive layer 128 may be a single layer or multiple layers and material of which may be selected from a group consisting of Cr, Ti, Pt and an alloy thereof, which contacts a conductive substrate 130 (FIG. 4) and results in good adhesion. In addition, the second adhesive conductive layer 128 can also adhere to the first adhesive conductive layer 126 tightly. According to the present invention, the LED epitaxy structure 101 is fixed by the transparent dielectric layer 110, the adhesion between each layer in the LED epitaxy structure is good as well, and the ohmic contact layer 116, the reflective layer 120 and the LED epitaxy structure 101 are adhered tightly by the adhesive conductive complex layer 125. Therefore, as a laser beam is employed to perform the lift-off technology for the substrate, any possible peeling will not occur. Optionally, the ohmic contact layer 116 and the reflective layer 120 are etched partially to form a second opening 124, which will be discussed in the following.

Figure 4:
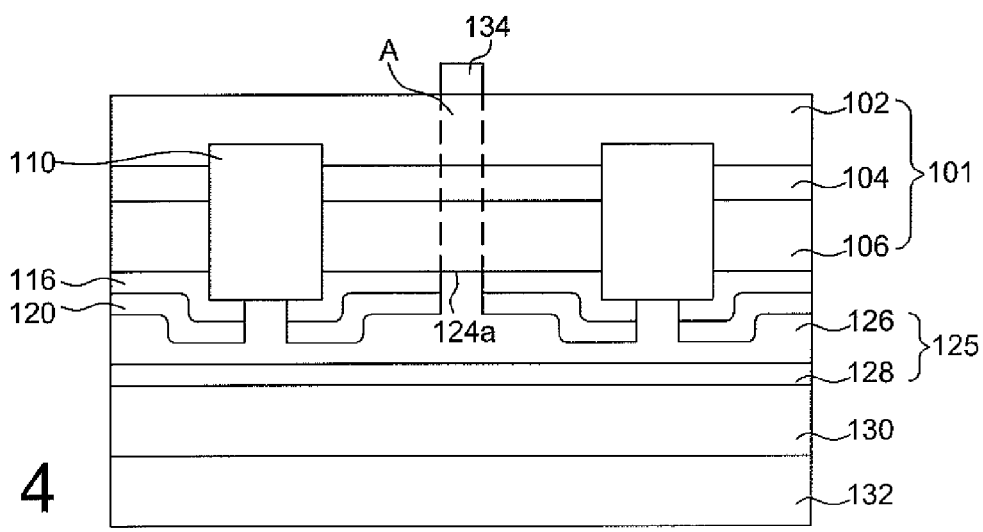

As shown in FIG. 4, the substrate 100 is removed from the structure of FIG. 3 by the lift-off technology. An adhesive layer (not shown) is formed on a conductive substrate 130, and then the adhesive layer is adhered to the adhesive conductive complex layer 125 by thermal pressure, so that the conductive substrate 130 can adhere to the adhesive conductive complex layer 125. Cathode electrode 132 and anode electrode 134 are fabricated respectively. The width of the anode electrode 134 is substantially equal to that of the second opening 124 for the current effect. The lithography and etching process parameters of forming the second opening 124 are determined according to the designed width of the anode electrode 134, to ensure that the width of the anode electrode 134 is substantially equal to that of the second opening 124.

The material of the ohmic contact layer 116 shown in FIG. 4, e.g. ITO can form good ohmic contact with p-type semiconductor layer 106, but the materials of the first adhesive conductive layer 126, e.g. Cr, and the p-type semiconductor layer 106 cannot form ohmic contact. In other words, a current blocking will form between the first adhesive conductive layer 126 and p-type semiconductor layer 106, making the current flow in region A reduce, and lights produced from region A is reduced as well. The brightness in regions other than region A will increase relatively. Therefore, with the arrangement of the width and the position of anode electrode 134 corresponding to those of the second opening 124, the issue that lights emitting toward anode electrode 134 is absorbed by the anode electrode 134 is overcome.

Figure 5A:
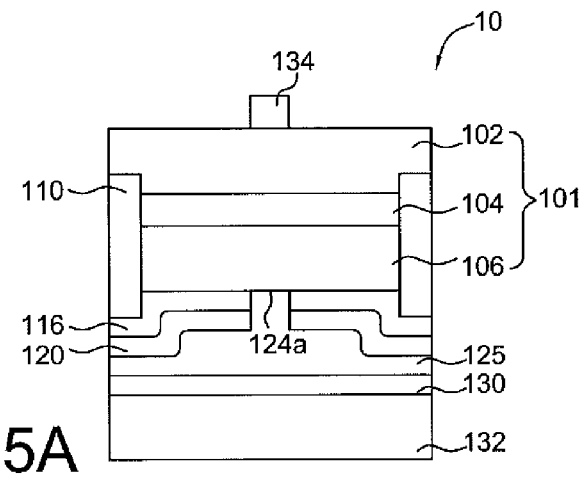
FIGS. 5A-5D are embodiments of the LED of the present invention.
Figure 5B:
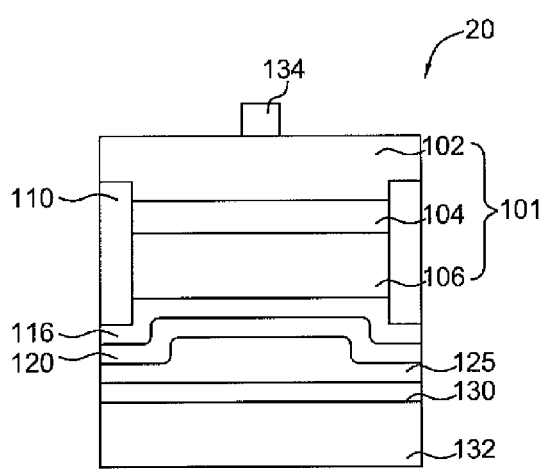
Figure 5C:
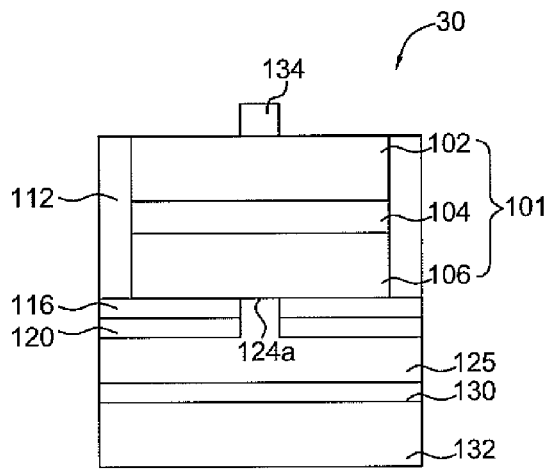
Figure 5D:
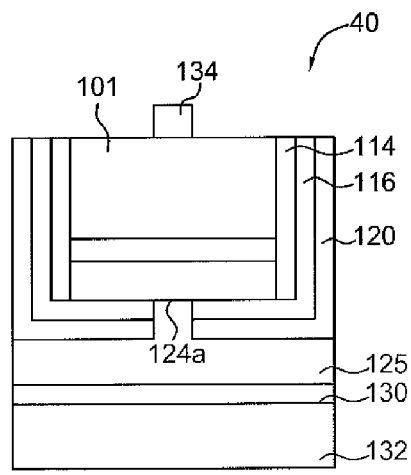

Finally, the transparent dielectric layer 110 is cut to form a final structure of the LED 10, as shown in FIG. 5A. Other embodiments of the LED of the present invention are disclosed in FIGS. 5B, 5C and 5D. Comparing to the LED 10 shown in FIG. 5A, the LED 20 shown in FIG. 5B has no second opening 124 in FIG. 5A. The LED 30 of FIG. 5C is fabricated by using the structure shown in FIG. 1B, then by performing the fabricating steps of FIGS. 2-4 and the cutting step. The LED 40 of FIG. 5D is fabricated by using the structure shown in FIG. 1C, and selectively removing a bottom portion 114a of the transparent dielectric layer (or forming a transparent dielectric layer with no bottom portion 114a in FIG. 1C), performing the fabricating steps of FIGS. 2-4, and the cutting step. The LEDs 10, 20 and 30 have the transparent dielectric layer 110 or 112 respectively, therefore the sidewall output of lights of these LEDs is increased. The entire LED epitaxy structure 101 is clad in the reflective layer 120 of the LED 40, so that lights can emit toward a same direction, making the brightness of the LED 40 increase.

By means of the detailed descriptions of what is presently considered to be the most practical and preferred embodiments of the subject invention, it is the expectation that the features and the gist thereof are plainly revealed. Nevertheless, these above-mentioned illustrations are not intended to be construed in a limiting sense. Instead, it should be well understood that any analogous variation and equivalent arrangement is supposed to be covered within the spirit and scope to be protected and that the interpretation of the scope of the subject invention would therefore as much broadly as it could apply.

What claim is:

1. A light emitting diode, comprising:
   a conductive substrate;
   an adhesive conductive complex layer on the conductive substrate;
   a reflective layer on the adhesive conductive complex layer;
   an ohmic contact layer on the reflective layer;
   an opening passing through the reflective layer and the ohmic contact layer;
   a light emitting diode epitaxy structure on the ohmic contact layer, and the light emitting diode epitaxy structure including at least one sidewall; and
   a transparent dielectric layer on the at least one sidewall of the light emitting diode epitaxy structure;
   wherein the adhesive conductive complex layer fills the opening such that the adhesive conductive complex layer is in direct physical contact with the light emitting diode epitaxy structure.

2. The light emitting diode of claim 1, wherein the transparent dielectric material is selected from a group consisting of SiO$_2$, Si$_3$N$_4$, bisbenzocyclobutene and polyimide.

3. The light emitting diode of claim 1, wherein the adhesive conductive complex layer comprises a first conductive layer comprising a material selected from a group consisting of Cr, Ti, Pt and an alloy thereof.

4. The light emitting diode of claim 3, wherein the adhesive conductive complex layer further comprises a second conductive layer comprising a material selected from a group consisting of Ni, Au and an alloy thereof.

5. The light emitting diode of claim 1, wherein the light emitting diode epitaxy structure comprises:
   a first doped semiconductor layer;
   a second doped semiconductor layer; and
   an active layer between the first doped semiconductor layer and the second doped semiconductor layer.

6. The light emitting diode of claim 5, further comprising a first electrode and a second electrode.

7. The light emitting diode of claim 6, wherein the adhesive conductive complex layer contacts a surface of the second doped semiconductor layer via the opening.

8. The light emitting diode of claim 6, wherein the first electrode is on the first doped semiconductor layer.

9. The light emitting diode of claim 5, wherein the first doped semiconductor layer is an n-type semiconductor layer and the second doped semiconductor is a p-type semiconductor layer.

10. The light emitting diode of claim 8, wherein the position of the first electrode is corresponding to the opening.

11. The light emitting diode of claim 8, wherein the width of the first electrode is substantially equal to the width of the opening.

12. A light emitting diode, comprising:
    a conductive substrate;
    an adhesive conductive complex layer on the conductive substrate;
    a reflective layer on the adhesive conductive complex layer;
    an ohmic contact layer on the reflective layer;
    an opening passing through the reflective layer and the ohmic contact layer; and
    a light emitting diode epitaxy structure on the ohmic contact layer;
    wherein the adhesive conductive complex layer fills the opening such that the adhesive conductive complex layer is in direct physical contact with the light emitting diode epitaxy structure.

13. The light emitting diode of claim 12, wherein the adhesive conductive complex layer comprises a first conductive layer comprising a material selected from a group consisting of Cr, Ti, Pt and an alloy thereof.

14. The light emitting diode of claim 13, wherein the adhesive conductive complex layer further comprises a second conductive layer comprising a material selected from a group consisting of Ni, Au and an alloy thereof.

15. The light emitting diode of claim 12, wherein the light emitting diode epitaxy structure comprises:
    a first doped semiconductor layer;
    a second doped semiconductor layer; and
    an active layer between the first doped semiconductor layer and the second doped semiconductor layer.

16. The light emitting diode of claim 15, further comprising a first electrode and a second electrode.

17. The light emitting diode of claim 15, wherein the adhesive conductive complex layer contacts a surface of the second doped semiconductor layer via the opening.

18. The light emitting diode of claim 16, wherein the first electrode is on the first doped semiconductor layer.

19. The light emitting diode of claim 18, wherein the position of the firest electrode is corresponding to the opening.

20. The light emitting diode of claim 18, wherein the width of the firest electrode is substantially equal to the width of the opening.

21. The light emitting diode of claim 15, wherein the first doped semiconductor layer is an n-type semiconductor layer and the second doped semiconductor is a p-type semiconductor layer.

22. The light emitting diode of claim 12, further comprising a transparent dielectric layer on at least one sidewall of the light emitting diode epitaxy structure.

23. The light emitting diode of claim 19, wherein the transparent dielectric material is selected from a group consisting of $SiO_2$, $Si_3N_4$, bisbenzocyclobutene and polyimide.

* * * * *

UNITED STATES PATENT AND TRADEMARK OFFICE
CERTIFICATE OF CORRECTION

PATENT NO. : 7,652,302 B2  
APPLICATION NO. : 11/108966  
DATED : January 26, 2010  
INVENTOR(S) : Tsai et al.

It is certified that error appears in the above-identified patent and that said Letters Patent is hereby corrected as shown below:

Column 6, line 27, "firest" should be changed to --first--;  
Column 6, line 29, "firest" should be changed to --first--;  
Column 6, line 40, "polyimide" should be changed to --polymide--.

Signed and Sealed this

Thirteenth Day of April, 2010

David J. Kappos  
*Director of the United States Patent and Trademark Office*

UNITED STATES PATENT AND TRADEMARK OFFICE
CERTIFICATE OF CORRECTION

PATENT NO. : 7,652,302 B2  Page 1 of 1
APPLICATION NO. : 11/108966
DATED : January 26, 2010
INVENTOR(S) : Tsai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 392 days.

Signed and Sealed this

Twenty-third Day of November, 2010

David J. Kappos
*Director of the United States Patent and Trademark Office*